(12) United States Patent
Chaji et al.

(10) Patent No.: US 12,408,486 B2
(45) Date of Patent: Sep. 2, 2025

(54) HIGH EFFICIENCY MICRODEVICE

(71) Applicant: VueReal Inc., Waterloo (CA)

(72) Inventors: Gholamreza Chaji, Waterloo (CA); Ehsanollah Fathi, Waterloo (CA); Hossein Zamani Siboni, Waterloo (CA)

(73) Assignee: VueReal Inc., Waterloo (CA)

( * ) Notice: Subject to any disclaimer, the term of this patent is extended or adjusted under 35 U.S.C. 154(b) by 596 days.

(21) Appl. No.: 17/631,005

(22) PCT Filed: Jul. 29, 2020

(86) PCT No.: PCT/CA2020/051042
§ 371 (c)(1),
(2) Date: Jan. 28, 2022

(87) PCT Pub. No.: WO2021/016712
PCT Pub. Date: Feb. 4, 2021

(65) Prior Publication Data
US 2022/0302338 A1 Sep. 22, 2022

Related U.S. Application Data

(60) Provisional application No. 62/964,184, filed on Jan. 22, 2020, provisional application No. 62/880,498, filed on Jul. 30, 2019.

(51) Int. Cl.
*H10H 20/816* (2025.01)
*H01L 23/58* (2006.01)
(Continued)

(52) U.S. Cl.
CPC .......... *H10H 20/816* (2025.01); *H01L 23/58* (2013.01); *H10H 20/062* (2025.01);
(Continued)

(58) Field of Classification Search
CPC ... H01L 33/0337; H01L 33/62; H01L 27/153; H01L 33/06; H01L 33/0041; H01L 33/04;
(Continued)

(56) References Cited

U.S. PATENT DOCUMENTS

2005/0195305 A1 9/2005 Lyu et al.
2015/0380461 A1* 12/2015 Robin ............... H01L 31/03529
257/459

(Continued)

FOREIGN PATENT DOCUMENTS

| CN | 1665033 A | 9/2005 |
| CN | 107851654 A | 3/2018 |
| TW | 201909406 A | 3/2019 |

OTHER PUBLICATIONS

PCT International Search Report and Written Opinion relating to PCT application No. PCT/CA2020/051042 dated Oct. 1, 2020.
(Continued)

*Primary Examiner* — Eliseo Ramos Feliciano
*Assistant Examiner* — Brad A Knudson
(74) *Attorney, Agent, or Firm* — Rowand LLP

(57) ABSTRACT

A vertical solid state device comprising: a connection pad; and side walls comprising a metal-insulator-semiconductor (MIS) structure; wherein a gate of the MIS structure is shorted to at least one contact of the vertical solid state device and a threshold voltage (VT) of the MIS structure is adjusted to increase the efficiency of the device.

5 Claims, 2 Drawing Sheets

(51) Int. Cl.
 *H10H 20/00* (2025.01)
 *H10H 20/811* (2025.01)
 *H10H 20/812* (2025.01)

(52) U.S. Cl.
 CPC ........ *H10H 20/811* (2025.01); *H10H 20/812* (2025.01); *H10H 20/8162* (2025.01); *H10H 20/052* (2025.01)

(58) Field of Classification Search
 CPC ....... H01L 33/25; H01L 23/58; H10H 20/816; H10H 20/062; H10H 20/811; H10H 20/812; H10H 20/8162; H10H 20/052
 See application file for complete search history.

(56) References Cited

U.S. PATENT DOCUMENTS

| 2017/0186907 | A1* | 6/2017 | Chaji | H01L 33/0037 |
| 2018/0176490 | A1* | 6/2018 | Nakamizo | H04N 25/75 |
| 2018/0287010 | A1* | 10/2018 | Sung | B82B 3/0066 |

OTHER PUBLICATIONS

ROC: TW Office Action relating to TW application No. 109125881, dated Mar. 7, 2024.
PRC (China): CN Office Actoin relating to CN application No. 202080053948.7, dated Apr. 26, 2025.

* cited by examiner

HIGH EFFICIENCY MICRODEVICE

BACKGROUND AND FIELD OF THE INVENTION

The present invention pertains to vertical solid state devices and methods of manufacture thereof. More particularly, the present disclosure relates to high efficiency microdevices.

Sidewall defects are one of the main reasons for performance degradation of microdevices. One approach to enhance the performance is to use a gate around the device to deactivate the defects by biasing the gate. The challenge is the use of extra electrodes in a small device.

SUMMARY OF THE INVENTION

According to one embodiment, there is provided a vertical solid state device comprising a p-contact, p-doped layer, different active layers (e.g. quantum well, barrier, etc.), n-doped layer, a connection pad and side walls comprising a metal-insulator-semiconductor (MIS) structure, wherein gate of the MIS structure is shorted at least one contact of the vertical solid state device.

In another embodiment, the gate of MIS structure is shorted to n-contact either through n-bumps or n-ohmics.

In one embodiment, the gate of MIS structure may comprise a full or partial gate covering the sidewalk of the MIS structure.

In one aspect of the invention, the disclosed structure is compatible with flip chip structures of vertical solid state devices.

According to one aspect, the vertical solid state device is a microdevice.

In another aspect of the invention, the shorting of the gate to n-contact can result in a higher external quantum efficiency (EQE) as compared to normal microdevice, wherein the shorting the gate to n-contact comprises providing a zero bias difference between the gate and n-contact.

In another aspect of the invention, a threshold voltage associated with the gate on the sidewall of the microdevice can be engineered to be greater than zero or close to zero (VT>=O) can increase the EQE.

In one aspect of the invention, the threshold voltage also be within the range that provides the EQE range within the predefined range of the maximum EQE.

In one aspect of the invention, the disclosed flip chip structure is less sensitive to electrostatic discharge ESD.

In another aspect of the invention relates to a method to increase efficiency in a vertical solid state device, the method comprising, providing a solid state device comprising a connection pad and side walls comprising a metal-insulator-semiconductor (MIS) structure, applying a biasing voltage to a gate electrode connected to the MIS structure and shorting the MIS structure to a n-contact of the vertical solid state device, and keeping the biasing voltage of the gate electrode less than a threshold voltage of the MIS structure to increase the efficiency of the vertical solid state device.

BRIEF DESCRIPTION OF THE DRAWINGS

The foregoing and other advantages of the disclosure will become apparent upon reading the following detailed description and upon reference to the drawings.

Figure 1:
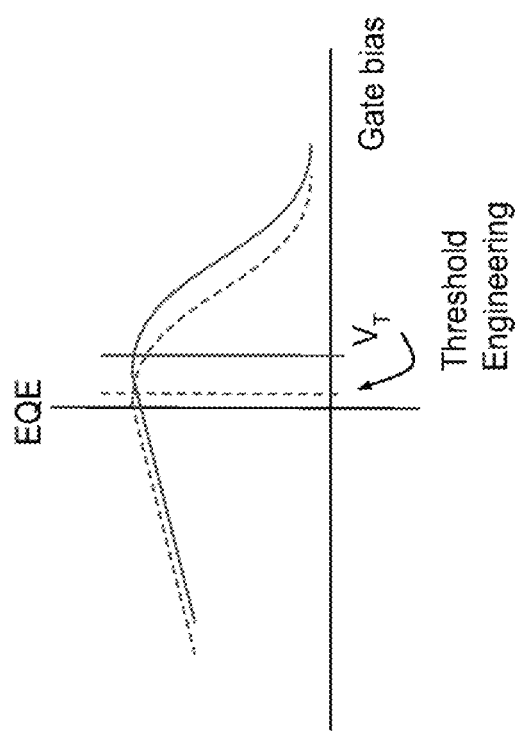
FIG. 1 shows typical external quantum efficiency (EQE) of a microdevice under different gate bias, in accordance with an embodiment of the invention.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Integrating micro optoelectronic devices into a system substrate can offer high performance and high functionality systems. In order to improve the cost and create higher pixel density devices, the size of the optoelectronic devices should be reduced. Examples of optoelectronic devices are sensors and light emitting devices, such as, for example, light emitting diodes (LEDs). As the size of these devices is reduced, however, device performance can start to suffer. Some reasons for reduced performance include but are not limited to higher leakage current due to defects, charge crowding at interfaces, imbalance charge, and unwanted recombination's such as Auger and nonradiative recombination.

Various transferring and bonding methods may be used to transfer and bond device layers to the system substrate. In one example heat and pressure may be used to bond device layers to a system substrate. In a vertical solid state device, the current flow in the vertical direction predominantly defines the functionality of the device. Light Emitting Diodes (LED) may be categorized as a vertical solid state device. A vertical device is an optoelectronic device fabricated by forming a three dimensional structure in a stack of different layers where the current goes from one side of the device to the other (generally from top of the stack to the bottom stack layer or vice versa). This structure has a top side, a bottom side, middle layers stacked between the top and bottom layers, and side walls surrounding the top, bottom and middle layers. In one case, the top layer can be a p-doped layer and the bottom is the n-doped layer. The micro device can be on a buffer layer. Here, the proposed fabrication methods are used to limit the lateral current flow of these devices. Here, led or microLED is used to explain the invention but similar techniques can be used for other types of vertical microdevices (e.g. sensors).

Patterning LED into micro size devices to create an array of LEDs for display applications come with several issues including material utilization, limited PPI, and defect creation. In one example, in a vertical solid state device, the current flow in the vertical direction predominantly defines the functionality of the device. There remains a need for improved vertical solid state devices.

Light Emitting Diodes LED can be categorized as a vertical solid state micro device. The other type of micro devices may be sensors, Light Emitting Diodes (LEDs) or any other solid devices grown, deposited or formed on a substrate. The substrate may be the native substrate of the device layers or a receiver substrate where device layers or solid state devices are transferred to.

As mentioned above, sidewall defects are one of the main reasons for performance degradation of microdevices. One approach to enhance the performance is to use a gate electrode around the device to deactivate the defects by biasing the gate. The challenge is the use of extra electrodes in a small device.

FIG. 1 shows typical external quantum efficiency (EQE) of a microdevice under different gate bias. Here, threshold voltage (VT) is the gate voltage that results in the highest EQE for a given device current.

According to one embodiment, one approach to reduce the number of electrodes is to short the gate to one of the other microdevice contacts (either p or n). However, the threshold voltage should be designed so that the bias on the gate caused by shorting to other microdevice contact is as close as possible to the maximum EQE.

In the case of shorting to air-contact, the VT should be close to the bias voltage of the n-contact. However, it should be also within the range that provides the EQE range within the predefined range of the maximum EQE.

In the case of shorting to p-contact, the VT should be close to the bias difference between the p and n. However, it should be also within the range that provides the EQE range within the predefined range of the maximum EQE.

The threshold voltage (VT) engineering can be done as part of process, layer engineering, or charge implantation.

The EQE graph with different gate voltages and threshold voltage can be seen in FIG. 1, wherein the EQE is maximum at a threshold voltage. The threshold voltage can be engineered to be greater than zero or close to zero (VT>=0) can increase the EQE.

In one aspect of the invention, the disclosed flip chip structure is less sensitive to ESD.

Figure 2:
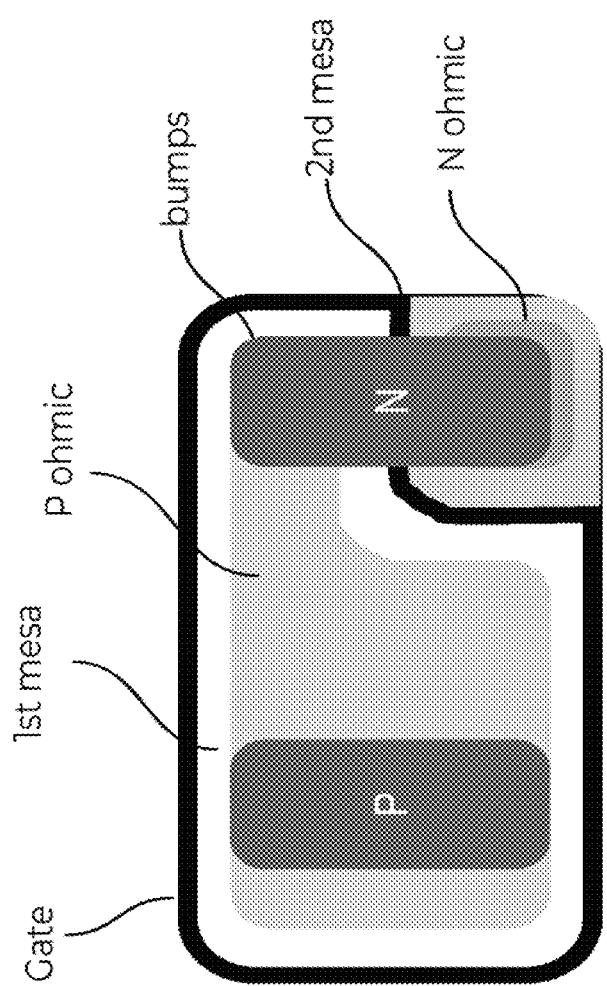
FIG. 2 shows a flip-chip vertical solid state with shorted gate MIS structure, in accordance with embodiments of the invention.

FIG. 2 shows a flip-chip vertical solid state with shorted gate MIS structure, in accordance with an embodiment of the invention. Here, a flip-chip structure of a vertical solid state device is provided. At least one MIS structure is formed on one of the device sidewalls. The MIS structure is biased through a gate electrode. The vertical solid state device has two functional contacts as ohmic p-contact and ohmic n-contact.

According to one embodiment, the gate of the MIS structure is shorted to one either n-contact or p-contact of the mesa structure either through n-bumps or n-ohmics or any other form of electrode. The gate of MIS structure may comprise a full gate covering the sidewalls of the microdevice.

According to one aspect of the invention, shorting of the gate electrode of the MIS structure to n-contact of the flip-chip structure can result in a higher external quantum efficiency (EQE) as compared to normal microdevice. Shorting the gate to n-contact comprises providing a zero voltage to the gate electrode. In another aspect there is provided a vertical current mode solid state device comprising a connection pad and side walls comprising a metal-insulator-semiconductor (MIS) structure, wherein leakage current effect of the vertical device is limited through the side walls by biasing the MIS structure.

According to another embodiment, within FIG. 2, the gate electrode of the MIS structure is a separate electrode and preferably for this embodiment the gate electrode bias voltage is less than the threshold voltage of the MIS structure. In this case, the MIS structure covers at least part of the n-layer. This is to counter the leakage current due to the sidewall effect in the n-contact region. It has been observed that this results in higher efficiency of the microdevice or EQE. This is mainly due to the observation that leakage current is substantially occurring in the n-contact area. As such biasing the electrode to a voltage less than the threshold of MIS structure between electrode and n-layer results in higher efficiency of the microdevice or EQE when the leakage current is substantially or entirely in the n-contact region.

Another related case, the sidewalls are covered by a dielectric and annealed at higher temperature. In another case, the sidewalk are treated in a high temperature chamber prior to the covering by dielectric. The dielectric can be silicon nitride, silicon oxide or ALD layers. In another case, a polymer such as BCB can be used.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A method to increase efficiency in a vertical solid state device, the method comprising:
   providing a solid state device comprising a connection pad and side walls comprising a metal-insulator-semiconductor (MIS) structure;
   applying a biasing voltage to a gate electrode connected to the MIS structure and shorting the MIS structure to a n-contact of the vertical solid state device; and
   keeping the biasing voltage of the gate electrode less than a threshold voltage of the MIS structure to increase the efficiency of the vertical solid state device.

2. The method of claim 1, wherein a leakage current due to sidewall effect is substantially in a n-contact region of the vertical solid state device.

3. The method of claim 1, wherein the threshold voltage is adjusted through one of: layer engineering, processing step, or charge implantation.

4. The method of claim 1, wherein a leakage current due to sidewall effect is entirely in a n-contact region of the vertical solid state device.

5. The method of claim 1, wherein the gate electrode fully covers the sidewalls of the device.

* * * * *